(12) United States Patent
Richter et al.

(10) Patent No.: US 8,324,108 B2
(45) Date of Patent: Dec. 4, 2012

(54) INCREASING ROBUSTNESS OF A DUAL STRESS LINER APPROACH IN A SEMICONDUCTOR DEVICE BY APPLYING A WET CHEMISTRY

(75) Inventors: Ralf Richter, Dresden (DE); Markus Lenski, Dresden (DE); Torsten Huisinga, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 127 days.

(21) Appl. No.: 13/034,777

(22) Filed: Feb. 25, 2011

(65) Prior Publication Data

US 2012/0028470 A1 Feb. 2, 2012

(30) Foreign Application Priority Data

Jul. 30, 2010 (DE) .......... 10 2010 038 744

(51) Int. Cl.
*H01L 21/302* (2006.01)
*H01L 21/461* (2006.01)
(52) U.S. Cl. .................. 438/704; 216/58
(58) Field of Classification Search .......... 438/689, 438/704; 216/57
See application file for complete search history.

(56) References Cited

U.S. PATENT DOCUMENTS

| 2006/0199326 | A1 | 9/2006 | Zhu et al. ................. 438/201 |
| 2006/0281240 | A1* | 12/2006 | Grudowski et al. ........ 438/199 |
| 2008/0076215 | A1* | 3/2008 | Chuang et al. ............. 438/199 |
| 2008/0164531 | A1 | 7/2008 | Jawarani et al. ............ 257/369 |
| 2009/0090974 | A1 | 4/2009 | Costrini et al. ............. 257/369 |
| 2009/0289306 | A1 | 11/2009 | Watanabe et al. .......... 257/369 |

OTHER PUBLICATIONS

Translation of Official Communication from German Patent Office for German Patent Application No. 10 2010 038 744.4-33 dated Mar. 14, 2011.

* cited by examiner

*Primary Examiner* — Roberts Culbert
(74) *Attorney, Agent, or Firm* — Williams, Morgan & Amerson, P.C.

(57) ABSTRACT

In a dual stress liner approach, unwanted material provided between closely spaced gate electrode structures may be removed to a significant degree on the basis of a wet chemical etch process, thereby reducing the risk of creating patterning-related irregularities. Consequently, the probability of contact failures in sophisticated interlayer dielectric material systems formed on the basis of a dual stress liner approach may be reduced.

20 Claims, 7 Drawing Sheets

INCREASING ROBUSTNESS OF A DUAL STRESS LINER APPROACH IN A SEMICONDUCTOR DEVICE BY APPLYING A WET CHEMISTRY

BACKGROUND OF THE INVENTION

1. Field of the Invention

The present disclosure generally relates to the field of semiconductor manufacturing, and, more particularly, to forming contact levels having a dielectric material system that are formed on the basis of differently stressed dielectric materials.

2. Description of the Related Art

Semiconductor devices, such as advanced integrated circuits, typically contain a great number of circuit elements, such as transistors, capacitors, resistors and the like, which are usually formed in a substantially planar configuration on an appropriate substrate having formed thereon a semiconductor layer. Due to the high number of circuit elements and the required complex layout of modern integrated circuits, the electrical connections of the individual circuit elements may generally not be established within the same level on which the circuit elements are manufactured, but require a plurality of additional "wiring" layers, which are also referred to as metallization layers. These metallization layers generally include metal-containing lines, providing the inner-level electrical connection, and also include a plurality of inter-level connections, which are also referred to as "vias," that are filled with an appropriate metal and provide the electrical connection between two neighboring stacked metallization layers.

Furthermore, the circuit elements are typically embedded in a dielectric material system, which provides the desired degree of passivation and robustness of the circuit elements prior to forming the complex metallization system. Hence, an appropriate contact regime or contact structure is implemented in the dielectric material system that passivates the circuit elements and that will also be referred to herein as an interlayer dielectric material. Due to the continuous shrinkage of the critical dimensions of the circuit elements, and thus due to the reduced lateral pitch of closely spaced circuit elements, the contact structure of the semiconductor device, which may be considered as an interface connecting the circuit elements of the device level with the metallization system, has to be adapted to the reduced feature sizes in the device level and the metallization system. For this reason, very sophisticated patterning strategies may have to be applied in order to provide the contact elements with the required density and with appropriate reduced dimensions, at least at the device level side, in order to appropriately connect to the contact regions, such as drain and source regions, gate electrode structures and the like, without contributing to pronounced leakage current paths and even short circuits and the like. In many conventional approaches, the contact elements or contact plugs are typically formed by using a tungsten-based metal together with an interlayer dielectric stack that is typically comprised of silicon dioxide in combination with an etch stop material, such as a silicon nitride material. Due to the very reduced critical dimensions of the circuit elements, such as the transistors, the respective contact elements have to be formed on the basis of contact openings with an aspect ratio which may be as high as approximately 8:1 or more, wherein a diameter of the contact openings may be 0.1 µm or significantly less for transistor devices of, for instance, the 65 nm technology node. In even further sophisticated approaches, and in very densely packed device regions, the width of the contact openings may be 50 nm and less.

In addition to establishing the vertical interconnects between the circuit elements and the complex metallization system, the contact level of sophisticated semiconductor devices may be further used for enhancing performance of transistor elements by implementing a strain-inducing mechanism. It is well known that performance of field effect transistors may significantly depend on the resistivity of the channel region of the transistors. For this reason, the reduction of the channel length has been one dominant design criterion in order to reduce the overall resistivity of the channel regions. The reduction of the channel length typically, however, requires an increased capacitive coupling in order to maintain the desired degree of controllability of the current flow in the channel region. For this reason, the thickness of the gate dielectric material, typically comprised of silicon dioxide-based materials, has been reduced, which, however, may result in a significant increase of the static leakage currents caused by charge carriers that may directly tunnel through an extremely thin gate dielectric material. Upon implementing channel lengths of beyond 100 nm, other performance-enhancing mechanisms have been taken into consideration in order to provide superior channel conductivity for a given design channel length. It is well known that, for instance, silicon material may exhibit a significant variability of charge carrier mobility when provided in a strained state. Consequently, by appropriately selecting the strain conditions of the silicon channel material, the charge carrier mobility of electrons and/or holes may be efficiently increased, thereby also achieving a significantly higher drive current capability and switching speed of the transistors. As a consequence, in the past, a plurality of efficient strain-inducing mechanisms have been developed, wherein one promising approach is based on the provision of highly stressed dielectric materials in the interlayer dielectric material system of the semiconductor device. For example, silicon nitride material, which is a well-established etch stop material used in interlayer dielectric material systems, may be efficiently provided with a high internal stress level by appropriately selecting the process parameters of the corresponding plasma enhanced chemical vapor deposition (CVD) process. For example, silicon nitride material may be deposited with a high internal compressive stress level of up to 2 GPa or even higher, which may result in significant performance gain of P-channel transistors. Similarly, silicon nitride material may also be efficiently deposited with a high internal tensile stress level of up to 2 GPa, thereby providing the possibility of significantly increasing performance of N-channel transistors. Generally, providing the etch stop material of the interlayer dielectric material system with a high internal stress level represents an efficient strain-inducing mechanism since these materials may be positioned closely to the actual transistor elements, that is, above and laterally adjacent to the gate electrode structures and on the drain and source regions. Upon further shrinkage of the critical dimensions, however, the lateral pitch between gate electrode structures may also have to be reduced, in particular in densely packed device areas, such as memory areas of complex semiconductor devices and the like, which may result in a very sophisticated surface topography upon depositing the highly stressed dielectric materials. Since the finally obtained magnitude of the strain in the corresponding channel regions may significantly depend on the internal stress level of the dielectric materials and the amount of these materials that may be positioned in close proximity to the transistor elements, typically, the deposition processes have been optimized so as to increase the internal stress level since the amount of stressed material is substantially determined by the overall device geometry. It turns out, however, that deposition recipes designed to provide superior internal stress levels may not at the same time provide high gap fill capabilities during the deposition process, which may result in significant deposition-related irregularities, such as voids and the like, which may result in pronounced device failures upon forming the contact elements in the interlayer dielectric material system. In particular, in sophisticated process strategies in which a tensile stressed dielectric material may be selectively placed above and adjacent to N-channel transistors and a compressively stressed dielectric material is positioned selectively above and adjacent to P-channel transistors, increased yield losses have been observed due to a pronounced increase of catastrophic contact failures.

With reference to FIGS. 1a-1d, a sophisticated dual stress liner approach, i.e., a strategy in which tensile stressed and compressive stressed dielectric materials may be selectively positioned in the vicinity of N-channel transistors and P-channel transistors, respectively, will now be described in more detail in order to identify possible mechanisms which may cause the significant increase in yield loss.

Figure 1A:
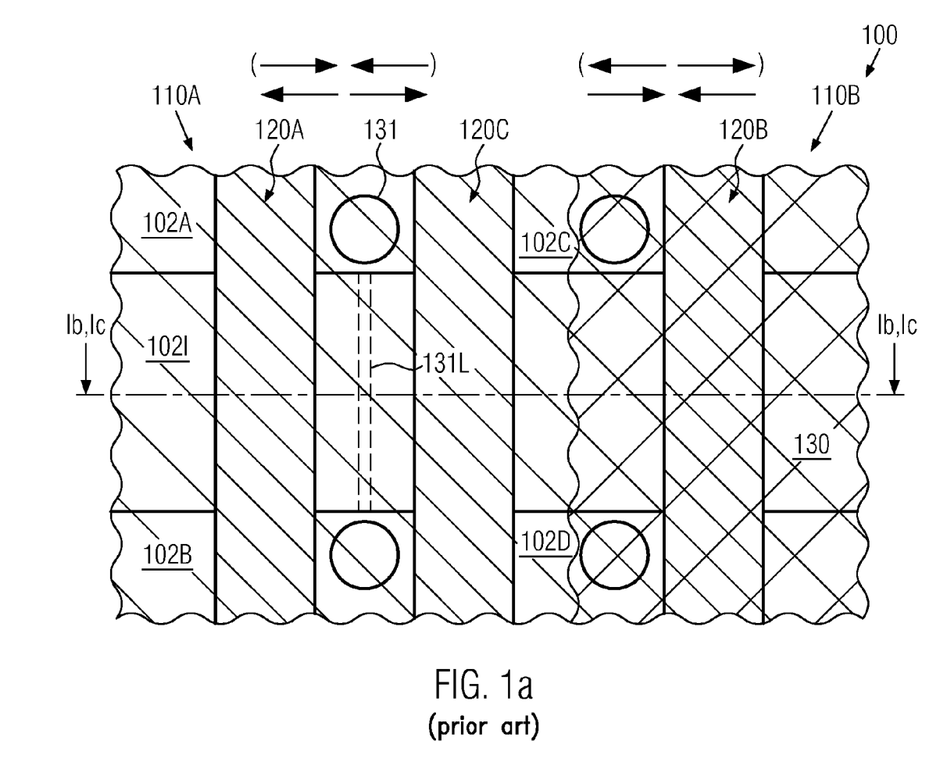
FIG. 1a schematically illustrates a top view of a semiconductor device including an interlayer dielectric material system formed on the basis of a conventional dual stress liner approach.

FIG. 1a schematically illustrates a top view of a semiconductor device 100 in a very advanced manufacturing stage. The semiconductor device 100 comprises a first device area 110B, which may be understood hereinafter as an area in which a certain type of strain may be required for enhancing performance of any transistor elements provided within the device area 110B. For example, in this area, a compressive strain or a tensile strain may result in superior performance of the corresponding transistor elements. Similarly, the semiconductor device 100 comprises a second device area 110A in which a certain type of strain may also result in superior performance of circuit elements formed therein, wherein the strain required in the area 110A is inverse with respect to the type of strain required in the device area 110B. In the device area 110B, one or more semiconductor regions or active regions 102C, 102D are provided, which are to be understood as semiconductor regions in and above which one or more transistor elements are formed, wherein, for convenience, gate electrode structures 120B of any such transistors are illustrated in FIG. 1a. As previously discussed, the current flow of a field effect transistor is controlled by a gate electrode structure, such as the structure 120B, while the drive current capability may also depend on the overall channel conductivity, as is also discussed above. Generally, the transistor performance and in particular the channel conductivity may depend on complex dopant profiles in the drain and source regions, the dopant concentration in the channel region, the length thereof and the strain level induced therein. Consequently, performance of any transistors provided in the active regions 102C, 102D may be enhanced by providing an interlayer dielectric material system 130 that may induce an appropriate strain component, as discussed above. In the device configuration as shown in FIG. 1a, an isolation region 102I, for instance in the form of a shallow trench isolation and the like, is formed so as to separate the active regions 102C, 102D, thereby electrically insulating the active regions 102C, 102D, if required.

Similarly, the device area 110A may comprise one or more active regions 102A, 102B which may require a specific type of strain-inducing material in order to enhance performance of corresponding transistors provided in the active regions 102A, 102B. Any such transistors may be represented by gate electrode structures 120A, 120C, which may be positioned in close proximity in accordance with sophisticated design rules of the device 100. In the example shown, the interlayer dielectric material system 130 may thus provide a type of strain in the active regions 102A, 102B that is inverse to the type of strain induced in the active regions 102C, 102D.

It should be appreciated, however, that, in other device areas, the active regions 102A, 102B may represent active regions of transistors of different conductivity type and thus the material system 130 may be appropriately configured to provide these different types of strain for the active regions 102A, 102B.

Moreover, as explained before, sophisticated contact elements 131 may have to be provided so as to connect to the circuit elements and thus to the corresponding active regions 102A, 102B, 103C, 102D in accordance with the overall requirements of the device 100. It has been observed, however, that, in particular in the context of critical dimensions of less than 100 nm and in densely packed device regions, such as the device area 110A, significant contact failures are generated which are believed to be caused by any short circuits or leakage paths connecting adjacent contact elements 131 across the isolation region 102I, as is indicated by the leakage path 131L.

Figure 1B:
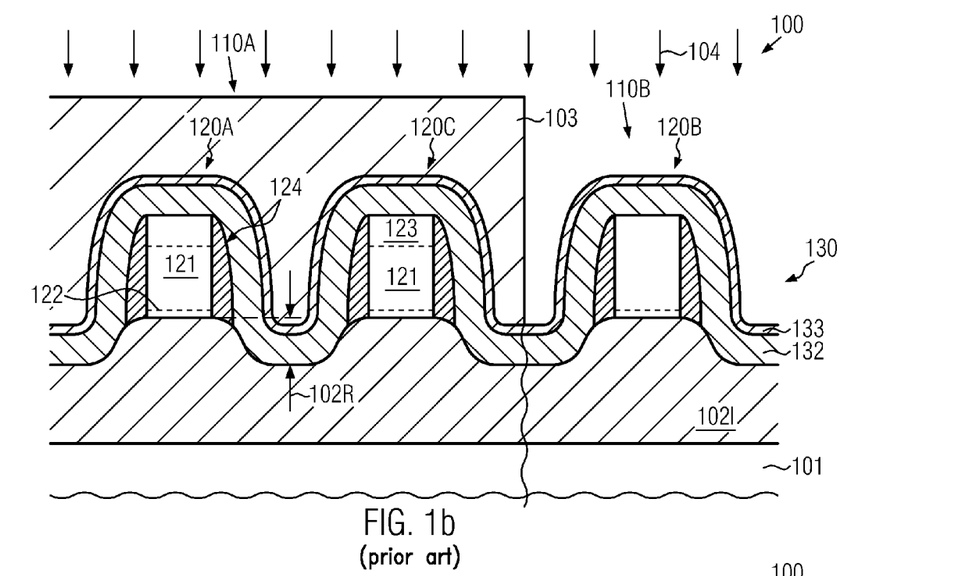
FIGS. 1b-1d schematically illustrate cross-sectional views of the semiconductor device during various manufacturing stages in which deposition-related irregularities caused by the dual stress liner approach may result in significant contact failures.

FIG. 1b schematically illustrates a cross-sectional view of the semiconductor device 100 along the line Ib as illustrated in FIG. 1a. In the manufacturing stage shown, the semiconductor device 100 comprises a substrate 101, such as a silicon substrate or any other appropriate semiconductor carrier material which is appropriate for providing thereon a semiconductor layer (not shown), such as a silicon layer and the like. It should be noted that the corresponding semiconductor layer may be divided into the various active regions, such as the regions 102A, 102B, 102C, 102D, as shown in FIG. 1a, by the isolation region 102I. It should be appreciated, however, that a crystalline semiconductor material may be provided below the isolation region 102I, while in a silicon-on-insulator (SOI) configuration, the isolation structure 102I may connect to a buried insulating material, which may also be provided below the active regions 102A, 102B, 102C, 102D shown in FIG. 1a. Moreover, in the manufacturing stage shown, the gate electrode structure 120B may be provided in the first device area 110B, while the gate electrode structures 120A, 120C are provided in the second device area 110A. The gate electrode structures 120A, 120B, 120C typically comprise an electrode material 121, such as a polycrystalline silicon material and the like, possibly in combination with a metal-containing portion 123, for instance in the form of a metal silicide, and a gate dielectric material 122 which may, however, not be provided above the isolation region 102I, depending on the process strategy used for forming the gate electrode structures. Furthermore, a sidewall spacer structure 124 may be provided so as to laterally enclose the electrode material or materials 121, 123. It should be appreciated, however, that, in very sophisticated approaches, the gate electrode structures 120A, 120B, 120C may also comprise high-k dielectric materials in combination with metal-containing electrode materials. Furthermore, in the manufacturing stage shown, a portion of the material system 130 may be provided in the form of a highly stressed dielectric layer 132, such as a silicon nitride material, in combination with an etch stop layer 133, such as a silicon dioxide material. In the example shown, the internal stress level of the material 132 may be appropriate so as to enhance performance of any transistors provided in the second device area 110A, wherein, for instance, a tensile stress level may enhance performance of N-channel transistors, while a compressive stress level may enhance performance of P-channel transistors.

The semiconductor device 100 as shown in FIG. 1b may be formed on the basis of the following process techniques. In an early manufacturing stage, the basic semiconductor layer formed above the substrate 101 may be divided into active regions by providing the isolation region 102I, as is, for instance, shown in FIG. 1a. To this end, sophisticated lithography, etch, deposition and planarization techniques may be applied in order to define the lateral size and position of active regions 102A, 102B, 102C, 102D, as shown in FIG. 1a. Next, the gate electrode structures 120A, 120B, 120C may be formed by providing appropriate materials for the gate dielectric layer 122, the electrode material 121 and possibly any further materials, such as high-k dielectric materials, metal-containing electrode materials, hard mask materials and the like. Based on a corresponding layer stack, complex lithography and patterning techniques may be applied in order to obtain the gate electrode structures with a desired gate length, i.e., in FIG. 1b, the horizontal extension of the electrode material 121, and with a desired lateral pitch of the gate electrode structures, in order to comply with the overall design criteria. If required, additional strain-inducing mechanisms may be implemented, for instance, by incorporating an embedded strain-inducing semiconductor material in at least some of the active regions 102A, 102B, 102C, 102D (FIG. 1a) and the like. Thereafter, the processing may be continued by forming drain and source regions (not shown) in combination with the sidewall spacer structure 124, which may be accomplished by using well-established masking regimes and implantation techniques for incorporating a desired type and concentration of dopant species into the corresponding active regions. After any anneal processes during which the final dopant profile may be adjusted and any implantation-induced damage may be re-crystallized, a metal silicide may be formed in the active regions and possibly in the gate electrode structures 120A, 120B, 120C, as indicated by 123, which may be accomplished by any well-established silicidation technique.

It should be appreciated that a plurality of complex etch and cleaning steps may be required during the manufacturing sequence for forming the basic transistor configuration including the gate electrode structures 120A, 120B, 120C, which may result in a pronounced material loss, in particular in the isolation region 102T, thereby forming corresponding recesses 102R. For example, a plurality of efficient cleaning recipes may be required, for instance, after any sophisticated etch techniques, resist removal processes and the like, in which, frequently, hydrofluoric acid and other efficient wet chemical solutions are applied which, however, may also efficiently remove silicon dioxide material, thereby increasingly contributing to a significant material loss in the isolation region 102I so that a pronounced surface topography may be created in the isolation region 102I, while a corresponding interaction of these processes with a semiconductor material, such as a silicon material, may be significantly less pronounced. Consequently, upon completing the basic transistor configuration, a pronounced surface topography may be obtained, in particular in the densely packed device area 110A due to the closely spaced gate electrode structures 120A, 120C, wherein this topography may further be increased due to the creation of the recesses 102R. Consequently, during the further processing in forming the complex material system 130, extremely sophisticated conditions may be encountered in the device area 110A. As previously discussed, during the deposition of the dielectric material 132, the process parameters may be appropriately adapted to as to obtain a very high internal stress level, which, however, may be associated with a reduced gap fill capability, thereby imposing specific restrictions with respect to layer thickness. Generally, the thickness of the layer 132 is selected so as to obtain a moderately high amount of highly stressed material while also enabling the deposition and patterning of a further highly stressed dielectric material and the patterning thereof during the further processing. For example, the highly stressed dielectric material 132 may be provided with a thickness of 30-80 nm, depending on the critical dimensions of the gate electrode structures 120A, 120C. Thereafter, the etch stop layer 133, for instance provided in the form of a silicon dioxide material, may be deposited by well-established deposition techniques. Next, an etch mask 103, such as a resist mask, may be provided so as to mask the second device area 110A while exposing the first device area 110B. Thereafter, an etch process 104 may be applied so as to first etch through the etch stop material 133 and subsequently provide an appropriate etch chemistry for removing the material 132, which may be accomplished on the basis of well-established plasma assisted etch recipes. It should be appreciated that, if desired, a thin etch stop material (not shown) may be provided below the highly stressed dielectric material 132 in order to enhance controllability of the etch process 104. After the selective removal of the layers 133 and 132 in the device area 110B, the processing is continued by removing the etch mask 103.

Figure 1C:
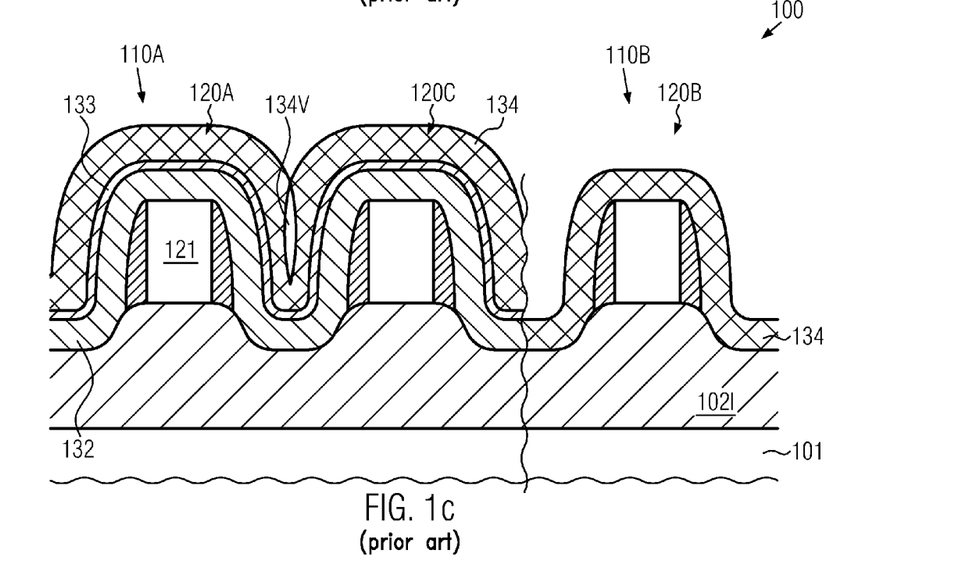

FIG. 1c schematically illustrates a cross-sectional view of the device 100 in a further advanced manufacturing stage. As illustrated, a further highly stressed dielectric material 134 is formed above the gate electrode structures 120A, 120B, 120C. As previously discussed, the layer 134 has an internal stress level that is inverse with respect to the stress of the dielectric material 132. For the deposition of the dielectric material 134, the same criteria apply as previously explained, so that, typically, process parameters are selected such that a high internal stress level is obtained while, however, achieving a reduced gap fill capability. Hence, due to the pronounced surface topography in the device area 110A, an increased probability of creating deposition-related irregularities may exist, thereby forming a void 134V between the closely spaced gate electrode structures 120A, 120C.

Figure 1D:
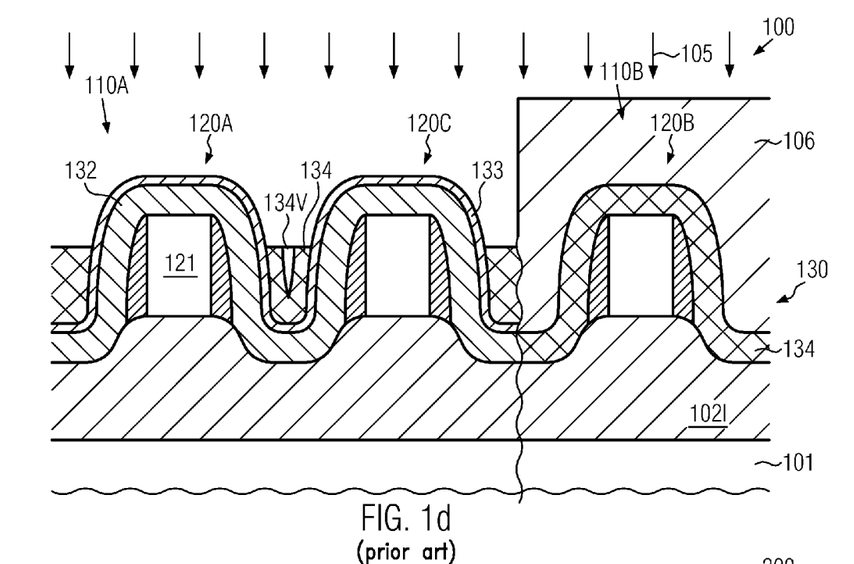

FIG. 1d schematically illustrates the device 100 in a further advanced manufacturing stage. In this stage, a further etch mask 106, such as a resist mask, is provided so as to cover the gate electrode structure 120B, while exposing the device area 110A. On the basis of the etch mask 106, a further plasma assisted etch process 105 is performed in order to remove the material layer 134 from above the device area 110A. To this end, a plurality of well-established plasma assisted etch recipes are available, for instance for removing silicon nitride material selectively with respect to silicon dioxide. Although it is highly desirable to substantially completely remove the material layer 134 from the device area 110A, it has been observed that, for sophisticated semiconductor devices, in particular in the device area 110A, significant portions of the material layer 134 may be preserved during the process 105, thereby possibly maintaining the void 134V, or at least a significant portion thereof. Consequently, upon depositing a further dielectric material, such as a silicon dioxide material, the void 134V or a portion thereof may still remain within the material system 130, which may result in significant device failure upon further processing, i.e., upon forming the contact elements 131 (FIG. 1a). That is, upon forming corresponding contact openings in the material system 130, a connection to the voids 134V may also be created and, upon refilling the contact openings with an appropriate contact material, such as tungsten, by CVD-like processes, tungsten material may be efficiently deposited into the void 134V, which may result in a highly conductive path. In some cases, the void 134V may extend from one contact element 131 to another contact element 131 provided in two different active regions, thereby establishing a conductive path, which may result in severe leakage currents or even short circuits, which may not be compatible with performance characteristics of the device 100 or which may even result in a catastrophic contact failure.

Without intending to restrict the present application to the following explanation, it is believed that the incomplete removal of the material 134 during the etch process 105 may be caused by the limited selectivity of the etch chemistry, which may have its deeper reasons in the pronounced surface topography. That is, during the etch process 105, the gas flow between the closely spaced gate electrode structures 120A, 120C may be reduced compared to less critical device areas so that a reduced etch rate may result in critical device areas, which may finally result in significant material residues of the layer 134 between the closely spaced gate electrode structures 120A, 120C. Increasing the total process time during the plasma assisted etch process 105 is, however, a less desirable option since, in this case, the etch stop layer 133 may be attacked in less critical device areas, such as above the gate electrode structures 120A, 120C, which may finally result in a significant material removal of the underlying highly stressed dielectric material 132. On the other hand, increasing the thickness of the etch stop material 133 is less than desirable since, in this case, it may be extremely difficult to remove the etch stop material 133 during the etch process 104 (FIG. 1b), which may thus result in significant non-uniformities upon removing the material 132 from above the device area 110B. Providing the etch stop layer 133 with a sufficient thickness after the removal of the layer 132 from above the device area 110B may, however, result in significantly reduced strain in the area 110B, since then the material layer 134 may have to be formed on the relatively thick etch stop layer 133.

Moreover, reducing the thickness of one or both of the layers 132 and 134 in order to provide a reduced probability of creating a void may also result in a significant loss of performance due to the reduced magnitude of strain induced in the corresponding device areas 110A, 110B, respectively.

In other approaches, the deposition-related irregularities may be accepted and the incorporation of a conductive material into the void 134V may be hindered by providing a silicon dioxide liner material in the contact opening prior to depositing the contact metal. In this case, an appropriate "sealing" of the contact opening may require moderately thick oxide liners or may be successfully applied for voids of reduced size so that, nevertheless, a significant risk of creating leakage paths may still be present. Furthermore, providing a moderately thick silicon dioxide liner in the contact openings may significantly reduce the critical dimensions thereof, which may thus result in a reduced conductivity, in particular when extremely scaled semiconductor devices are considered.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques in which dual stress liner approaches may be applied with superior process robustness by increasing the efficiency in removing an unwanted highly stressed dielectric material from specific device areas. To this end, a removal process may be applied in which a wet chemistry may be used, at least in a final phase of the removal process, in order to reduce the amount of unwanted material in critical locations, such as between closely spaced gate electrode structures, thereby also efficiently removing any deposition-related irregularities which may have been created during the preceding processing. It is well known that wet chemical etch recipes may have a significantly higher selectivity compared to plasma assisted etch processes, thereby enabling efficient material removal without unduly attacking an etch stop material, so that any limitations of well-established plasma assisted etch processes may be eliminated without requiring any pronounced modifications of the well-established stress liner processing.

One illustrative method disclosed herein relates to forming an interlayer dielectric material system of a semiconductor device. The method comprises removing a first portion of a first strain-inducing layer from above a first device area and preserving a second portion of the first strain-inducing layer formed above a second device area. Moreover, the method comprises forming a second strain-inducing layer above the second portion and above the first device area. Additionally, the method comprises performing a removal process so as to preserve a first portion of the second strain-inducing layer that is formed above the first device area and to remove material of a second portion of the second strain-inducing layer that is formed above the second portion of the first strain-inducing layer. Furthermore, a wet chemical etch process is performed so as to further remove material of the second portion of the second strain-inducing layer. Additionally, the method comprises forming at least one further dielectric material above the first and second strain-inducing layers.

A further illustrative method disclosed herein comprises forming a first strain-inducing layer of an interlayer dielectric material system of a semiconductor device above a first device area and a second device area, wherein the second device area comprises a plurality of spaced conductive lines. The method further comprises forming an etch stop liner above the first strain-inducing layer. Furthermore, the etch stop liner and the first strain-inducing layer are selectively removed from above the first device area. The method further comprises forming a second strain-inducing layer above the first and second device areas after removing the etch stop layer selectively from above the first device area. Additionally, the method comprises removing material of the second strain-inducing layer selectively above the second device area by performing a removal process that comprises a wet chemical etch process.

A still further illustrative method disclosed herein relates to forming an interlayer dielectric material of a semiconductor device. The method comprises forming a layer stack above a plurality of conductive lines, wherein the layer stack comprises a first strain-inducing layer and a second strain-inducing layer. Additionally, the method comprises performing a plasma assisted etch process so as to remove a first part of the second strain-inducing layer selectively to the first strain-inducing layer. Moreover, the method comprises performing a wet chemical etch process so as to further remove a second part of the second strain-inducing layer.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides manufacturing techniques in which a dual stress liner approach may be applied such that superior process robustness with respect to reducing patterning related irregularities may be obtained by applying a wet chemical etch recipe for removing a highly stressed dielectric material from critical device areas, such as between closely spaced gate electrode structures and the like. Since the effective selectivity of the critical removal process during the dual stress liner processing may be increased by taking advantage of the per se superior selectivity of a wet chemistry, other parameters of the dual stress liner approach, such as layer thickness, internal stress level and the like, may be selected so as to provide superior performance, while nevertheless achieving a significantly reduced yield loss compared to conventional approaches, as are, for instance, described with reference to FIGS. 1a-1d. Consequently, the concept of providing differently stressed dielectric materials above different transistor types may be applied with superior efficiency to highly scaled semiconductor devices, for instance corresponding to the 65 nm and 45 nm technology nodes and beyond.

With reference to FIGS. 2a-2h, further illustrative embodiments will now be described in more detail, wherein reference may also be made to FIGS. 1a-1d, if appropriate.

Figure 2A:
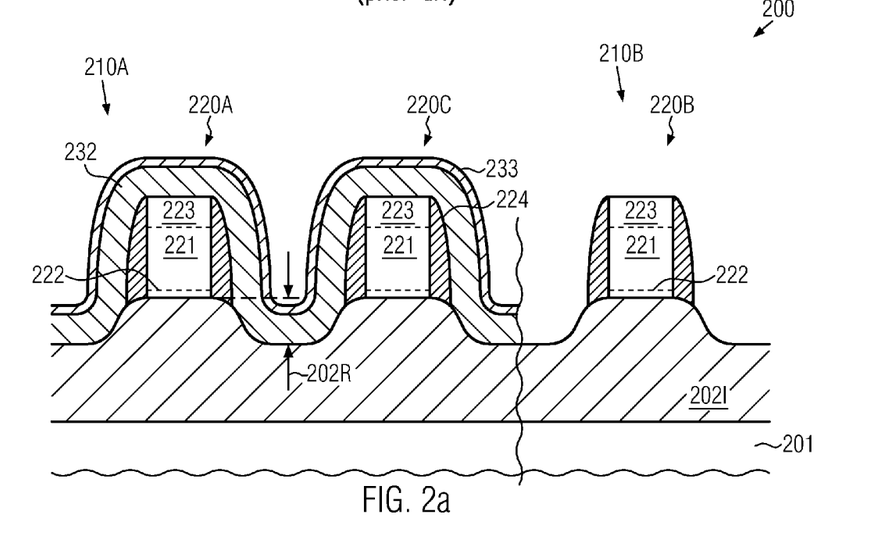
FIGS. 2a-2g schematically illustrate cross-sectional views of a semiconductor device during various manufacturing stages in forming an interlayer dielectric material system on the basis of a dual stress liner approach including a wet chemical removal process, according to illustrative embodiments.

FIG. 2a schematically illustrates a cross-sectional view of a semiconductor device 200 in a manufacturing stage in which an interlayer dielectric material system is to be provided on the basis of a dual stress liner approach, i.e., on the basis of a strategy in which highly stressed dielectric materials of different internal stress level may be positioned above and adjacent to different types of transistor. The cross-sectional view shown in FIG. 2a may correspond to a cross-section as is indicated in FIG. 1a by the section Ib, Ic. As illustrated, the device 200 may comprise a substrate 201, which may be provided in the form of a semiconductor material, such as a silicon material, an insulating material and the like. Furthermore, a semiconductor layer (not shown) may be formed above the substrate 201 and may comprise a plurality of semiconductor regions or active regions in and above which transistor elements are formed. For example, the semiconductor device 200 may have a similar geometric configuration as is also illustrated in FIG. 1a and is explained with reference to the semiconductor device 100. Consequently, in the cross-sectional view shown in FIG. 2a, an isolation region 202I may be provided within a base semiconductor layer so as to divide the semiconductor layer into various active regions, as discussed above. Moreover, a conductive line 220B, such as a portion of a gate electrode structure, may be formed on the isolation region 202I within a device area, indicated by 210B, in which a specific type of strain is to be induced in any corresponding active regions adjacent to the isolation region 202I within the device area 210B, as is also previously discussed with reference to the semiconductor device 100. Similarly, in a second device area 210A, a plurality of conductive lines 220A, 220C, such as gate electrode structures, may be provided on the isolation region 202I and may represent circuit elements of a densely packed device region. The conductive lines 220A, 220B, 220C may have a similar configuration as previously described with reference to the gate electrode structures 120A, 120B, 120C of the semiconductor device 100. For example, the conductive lines 220A, 220B, 220C may comprise an electrode material 221, possibly in combination with a dielectric material 222, which may be provided at least above any active regions in order to act as a gate dielectric material. Furthermore, a further electrode material 223, such as a metal silicide, may be provided, depending on the specific requirements of the semiconductor device 200. It should be appreciated that the structures 220A, 220B, 220C may have any other configuration as is also discussed above. Moreover, a sidewall spacer structure 224 may be provided as required by device and process requirements. It should be appreciated that a length of the conductive lines 220A, 220B, 220C may be 50 nm and less, while a spacing between the spacer structures 224 may also be on the same order of magnitude.

Moreover, in the manufacturing stage shown, a strain-inducing layer 232, such as a silicon nitride base material and the like, may be provided above the device area 210A and may thus have an internal stress level that is appropriate for enhancing performance of any transistor elements formed in active regions located within the device area 210A, as is also previously explained. Moreover, an etch stop liner 233, such as a silicon dioxide material and the like, may be formed on the strain-inducing dielectric layer 232. On the other hand, the layers 233 and 232 may be removed from above the device area 210B since, in this device area, an inverse type of strain may have to be induced by an appropriately provided stressed dielectric material.

The semiconductor device 200 as illustrated in FIG. 2a may be formed on the basis of any appropriate process strategy, as is, for instance, also described above with reference to the semiconductor device 100. That is, upon completing the basic configuration of any transistor elements, including the gate electrode structures 220A, 220B, 220C, a significant degree of recessing may have been generated in the isolation region 202I, as indicated by 202R, as is also discussed above. Thereafter, the dielectric layer 232 may be deposited so as to have a desired layer thickness and a high internal stress level, such as a compressive stress, when corresponding transistors of the gate electrode structures 220A, 220C may require a compressive strain in the corresponding channel regions, while, on the other hand, a tensile stress may be generated in the layer 232 upon depositing the dielectric material, when the transistors corresponding to the gate electrode structures 220A, 220C may require a tensile strain component. As also discussed above, a thin etch stop material (not shown) may be provided prior to depositing the layer 232. Thereafter, the etch stop layer 233 may be formed, for instance, by depositing an appropriate material, such as a silicon dioxide material, a high-k dielectric material such as hafnium oxide and the like, which may provide superior etch resistivity. In other cases, the etch stop layer 233 may be formed on the basis of a surface treatment performed after the deposition of the layer 232, for instance on the basis of an oxidizing plasma ambient and the like, thereby modifying a surface portion of the layer 232 into an oxide-like material, which may provide the desired etch resistivity. Next, an etch mask such as a resist mask may be provided so as to cover the device area 210B and a plasma assisted etch process may be performed so as to etch through the layer 233 and finally through the layer 232, as is also previously explained with reference to the semiconductor device 100. If desired, any additional etch stop material may also be removed from above the device area 210B, if provided, thereby enabling the deposition of a further strain-inducing material in close proximity to the gate electrode structure 220B and any active region positioned within the device area 210B.

Figure 2B:
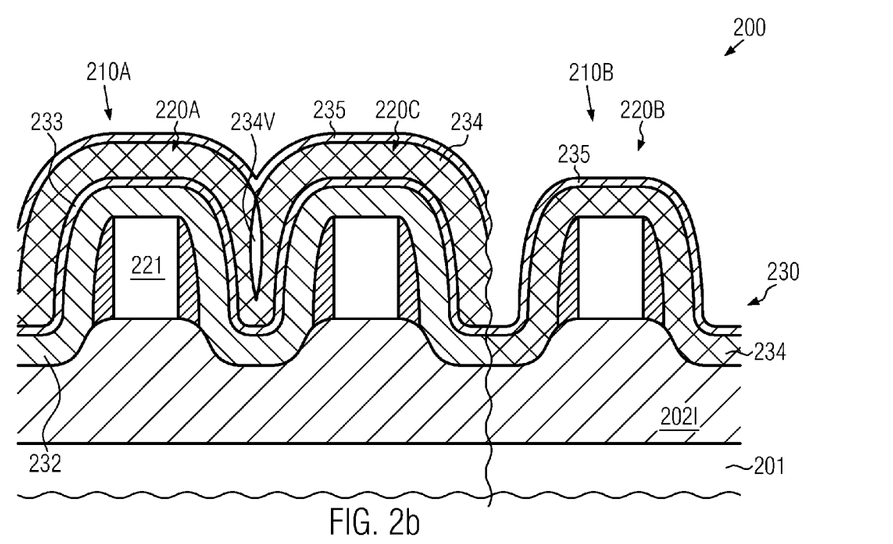

FIG. 2b schematically illustrates the device 200 in a further advanced manufacturing stage in which a further strain-inducing material layer 234 may be formed above the first and second device areas 210B, 210A with a type of internal stress as required in the device area 210B. As discussed above, the layers 234 and 232 may have inverse types of internal stresses. Moreover, a further etch stop material 235 may be formed on the strain-inducing layer 234, which, in some illustrative embodiments, may be accomplished by depositing an appropriate dielectric material, such as a silicon dioxide material, a high-k dielectric material and the like. In this respect, a high-k dielectric material is to be understood as any dielectric material having a dielectric constant of 10.0 and higher, which may generally provide superior etch resistivity compared to well-established conventional dielectrics, such as silicon dioxide. For example, a plurality of metal-based oxide materials, such as hafnium oxide, zirconium oxide, aluminum oxide and the like, may provide high etch resistivity. In other illustrative embodiments, a surface treatment may be performed, such as an oxidizing plasma and the like, in order to modify a surface portion of the layer 234 into an oxide-based material, which may thus have a high etch resistivity with respect to a plurality of plasma assisted and wet chemical etch recipes. For example, using a plasma treatment may enable a reduction of the thickness of the etch stop material 235, since a very "conformal" behavior upon forming the layer 235 may be achieved on the basis of a surface treatment.

As explained above, the material layers 232, the etch stop material 233 and the layer 234 may be provided on the basis of process parameters which may preferably be selected with respect to obtaining a desired magnitude of the corresponding induced strain in the device areas 210A, 210B, while accepting the creation of any pattern-related irregularities. For example, a void 234V may be generated, in particular between the closely spaced gate electrode structures 220A, 220C, as previously discussed.

Figure 2C:
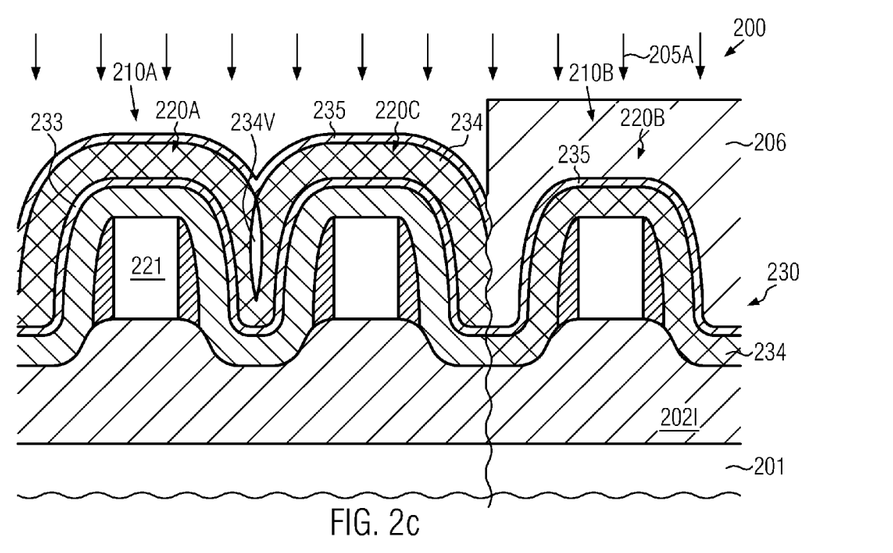

FIG. 2c schematically illustrates the device 200 with an etch mask 206 formed above the device area 210B so as to expose the device area 210A to an etch process 205A, in which the etch stop material 235 may be removed. Moreover, during the etch step 205A, an appropriate etch chemistry may be applied on the basis of plasma assisted recipes in order to efficiently remove material of the layer 234, wherein well-established process parameter settings may be applied, as are, for instance, also used in conventional strategies. For example, a plurality of plasma assisted etch recipes for removing silicon nitride material are well established, which may have a certain degree of selectivity with respect to silicon dioxide, high-k dielectric materials and the like.

Figure 2D:
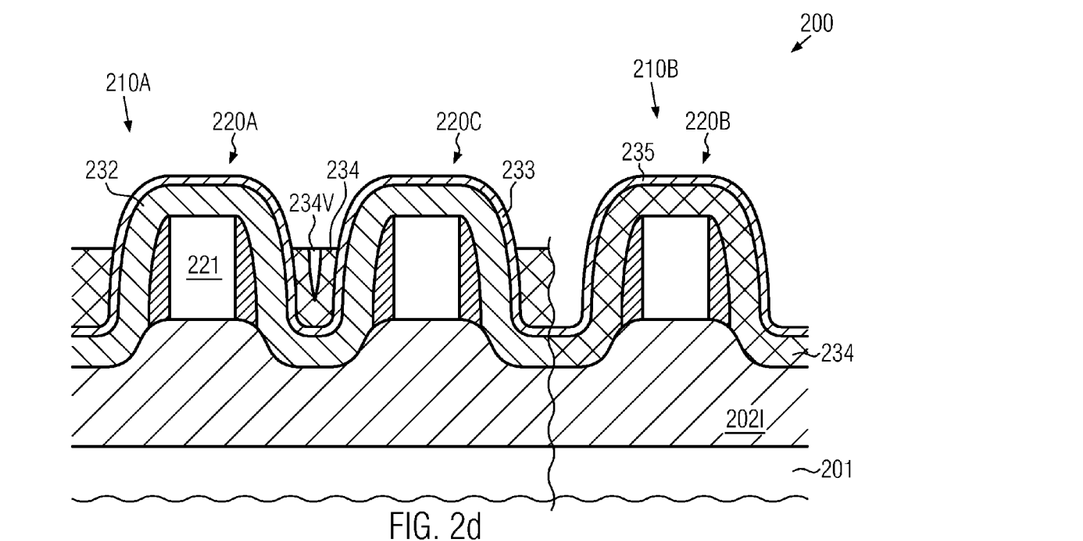

FIG. 2d schematically illustrates the semiconductor device 200 after the etch process 205A of FIG. 2c. As illustrated, the process parameters have been selected such that integrity of the etch stop layer 233 is still preserved in the device area 210A, thereby, however, resulting in an incomplete removal of the layer 234 so that even at least some of the irregularities, such as the void 234V, may still be present in a more or less complete state, as is also previously discussed with reference to the semiconductor device 100. In the embodiment shown in FIG. 2d, a resist material may moreover be removed from above the device area 210B, while, in other cases, the resist material may still be present, if considered appropriate for the further processing. Thus, in the embodiment shown, the gate electrode structure 220B may be covered by the etch stop material 235, possibly in combination with a resist material. In other illustrative embodiments (not shown), the deposition of the etch stop material 235 may be omitted after forming the strain-inducing layer 234, in which case the resist material may still be preserved above the gate electrode structure 220B so as to protect this structure during the further processing, if the etch resistivity of the resist mask is considered appropriate for a subsequent wet chemical etch process.

Figure 2E:
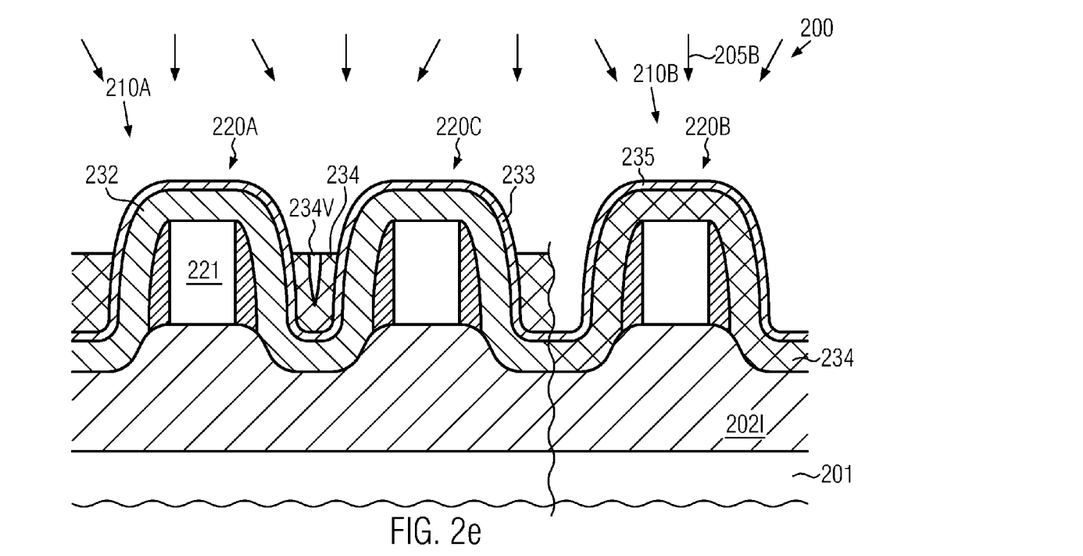

FIG. 2e schematically illustrates the semiconductor device 200 during a further etch process 205B, in which a wet chemistry may be applied so as to further reduce material of the layer 234 within the device area 210A. For example, hot phosphoric acid may have a high removal rate for silicon nitride-based materials, wherein a significantly higher degree of selectivity with respect to a plurality of etch stop materials, such as silicon dioxide, may also be achieved. Consequently, by performing the wet chemical etch process 205B, the material 234 may further be removed, while the etch stop liner 233 may still provide sufficient etch resistivity. Similarly, the etch stop material 235, possibly in combination with a resist material or, in other illustrative embodiments (not shown) a resist material, may provide the integrity of the layer 234 in the device area 210B. Consequently, during the wet chemical etch process 205B, the material 234 in the area 210A may be removed to a degree, wherein at least any cavities within the critical spaces between the gate electrode structures 220A, 220C may no longer exist upon the further processing, i.e., upon depositing a further dielectric material of the interlayer dielectric system of the device 200.

Figure 2F:
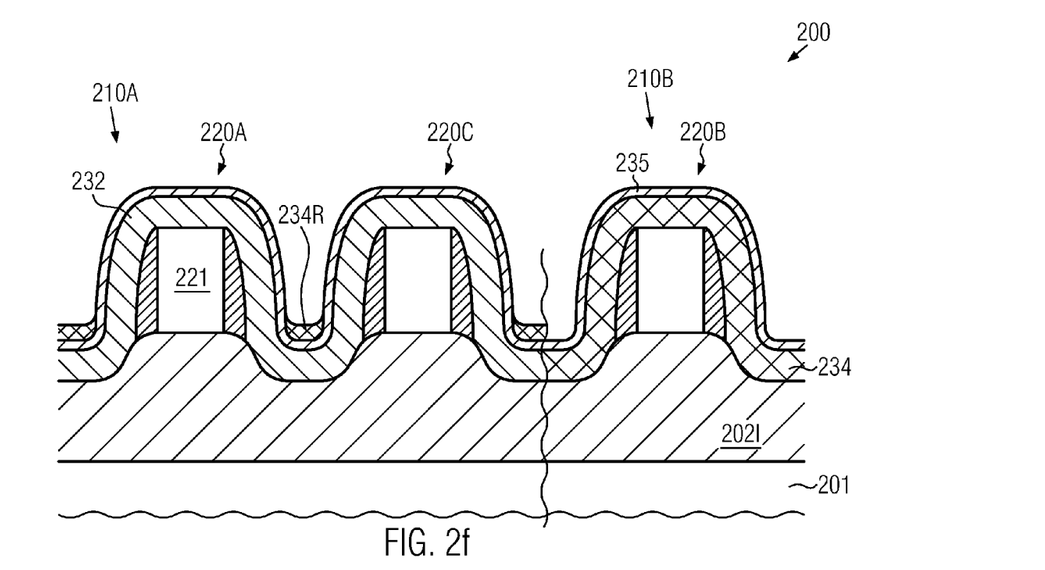

FIG. 2f schematically illustrates the semiconductor device 200 after the wet chemical etch process 205B of FIG. 2e. Thus, as illustrated, material residues 234R may still be present in the device area 210A, however, with a significantly reduced potential of creating any further patterning-related irregularities during the further processing. In some illustrative embodiments, the process parameters of the etch process may be selected such that a substantially non-critical amount of the residual material 234R may be achieved without generating any lateral etch damage in other sensitive device areas, as will be discussed later on with reference to FIG. 2h. In some illustrative embodiments, the material 234R may be substantially completely removed in the device area 210A.

Figure 2G:
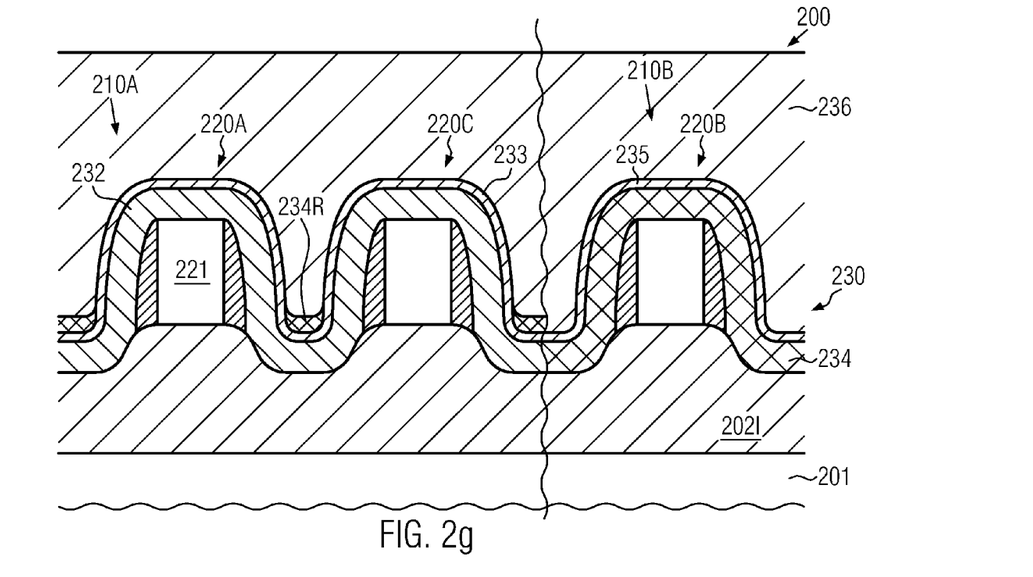

FIG. 2g schematically illustrates the semiconductor device 200 in a further advanced manufacturing stage. As shown, a further dielectric material 236, such as a silicon dioxide material, may be formed above the device areas 210A, 210B and may form, in combination with at least the strain-inducing layers 232 and 234, an interlayer dielectric material system 230 of the device 200. In the embodiment shown, the etch stop liners 233 and 235 may still be in place, while, in other cases, these materials may be removed prior to providing the dielectric material 236. Generally, the material 236 may be provided on the basis of appropriate deposition techniques, which may also have superior gap filling capabilities, thereby substantially void-free filling the space between the closely spaced gate electrode structures 220A, 220C. Consequently, due to the previously applied additional material removal step based on a wet chemistry, the amount of any residual material, such as the residues 234R, may significantly be reduced, thereby substantially avoiding the formation of any cavities in the system 230. Consequently, upon the further processing, for instance upon planarizing the material 236 and forming corresponding contact openings in the material system 230 so as to connect to any active regions, as is, for instance, shown in FIG. 1a with reference to the semiconductor device 100, the contact openings may thus not connect to any buried cavities or voids so that any additional dielectric liner materials in the contact openings may be omitted. Hence, upon refilling the contact openings with a contact material, such as tungsten, a superior degree of confinement of this material may be accomplished compared to conventional strategies, as discussed above with reference to FIGS. 1a-1d, thereby also significantly reducing the probability of creating contact failures. As a consequence, desired high strain levels may be obtained in the device areas 210A, 210B on the basis of the materials 232 and 234 since any other mechanisms may not be required, such as reducing the layer thickness, reducing the internal stress level in order to improve the gap filling capabilities of the deposition processes, providing etch stop liners with increased thickness and the like.

Figure 2H:
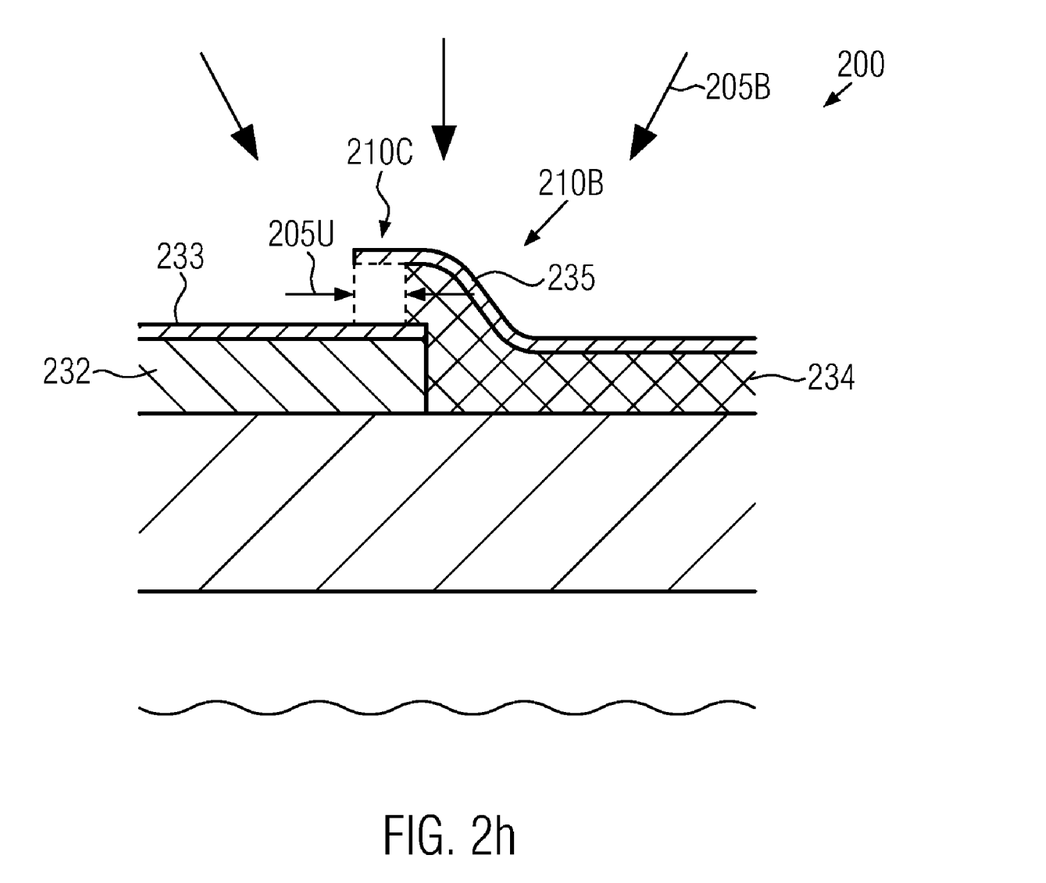
FIG. 2h schematically illustrates a cross-sectional view of a boundary region positioned between device areas requiring a tensile stressed dielectric material and a compressively stressed dielectric material, wherein process parameters of the wet chemical etch processes are controlled so as to maintain a certain overlap, according to further illustrative embodiments.

FIG. 2h schematically illustrates the semiconductor device 200 in the wet chemical etch process 205B in a boundary region 210C that laterally separates the device areas 210A and 210B. As illustrated, initially, the layers 232 and 234 may overlap in the boundary region 210C, which may be advantageous with respect to appropriately confining any underlying device levels in view of the further processing of the device 200. For example, as explained before, typically, complex metallization systems may have to be provided, for instance on the basis of copper and the like. In this case, the silicon nitride-based materials of the layers 232 and 234 may act as an efficient diffusion blocking material, for instance with respect to undue copper diffusion, wherein the overlap in the boundary region 210C may provide superior process margins upon patterning the layers 232 and 234 on the basis of resist materials formed by using lithography processes. That is, by providing a degree of overlapping, any acceptable variations during the lithography processes may thus be accommodated by the boundary region 210C. In some illustrative embodiments for the wet chemical etch process 205B, which may have a substantially isotropic etch behavior, the degree of under-etching of the etch stop material 235 may be determined and may be controlled such that a certain degree of overlap may still be preserved in the region 210C. To this end, an initial overlap may be increased compared to conventional strategies and appropriate process limits for an acceptable degree of under-etching, as indicated by 205U, may be established in advance, for instance on the basis of experiments and the like, in order to avoid undue lateral etch damage in the material 234. For example, for a given composition and etch conditions of the process 205B, an appropriate process time may be established so as to remove sufficient material while still maintaining the under-etching 205U within an allowable range. For example, the degree of the initial overlapping of the layers 232 and 234 may be selected so as to accommodate the desired vertical thickness of the material 234 to be removed in critical device areas, thereby ensuring a sufficient material removal while avoiding undue exposure of any underlying materials in the boundary region 210C.

As a result, the present disclosure provides manufacturing techniques in which dual stress liner approaches may be implemented such that superior process robustness may be achieved with respect to the creation of patterning-related irregularities by applying a wet chemistry upon removing a highly stressed dielectric material from critical device areas, for instance from between closely spaced conductive lines. Consequently, the applicability of dual stress liner approaches may be extended to more sophisticated device geometries, for instance for technology nodes based on critical dimensions of 32 nm of gate electrode structures and beyond, thereby allowing significant performance gain of planar transistor devices based on basically well-established process techniques.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming an interlayer dielectric material system of a semiconductor device, the method comprising:
removing a first portion of a first strain-inducing layer from above a first device area and preserving a second portion of said first strain-inducing layer formed above a second device area;
forming a second strain-inducing layer above said second portion and above said first device area;
performing a removal process so as to preserve a first portion of said second strain-inducing layer formed above said first device area and to remove material of a second portion of said second strain-inducing layer formed above said second portion of said first strain-inducing layer;
performing a wet chemical etch process so as to further remove material of said second portion of said second strain-inducing layer; and
forming at least one further dielectric material above said first and second strain-inducing layers.

2. The method of claim 1, wherein removing material of a second portion of said second strain-inducing layer comprises forming an etch mask so as to mask said first device area and wherein said wet chemical etch process is performed in the presence of said etch mask.

3. The method of claim 2, wherein forming said etch mask comprises forming an etch stop material and patterning said etch stop material by a resist mask.

4. The method of claim 3, wherein forming said etch stop material comprises depositing said etch stop material.

5. The method of claim 4, wherein forming said etch stop material comprises depositing at least one of a silicon dioxide material and a high-k dielectric material.

6. The method of claim 3, wherein forming said etch stop material comprises performing a surface treatment on said second strain-inducing layer.

7. The method of claim 1, wherein said first and second strain-inducing layers induce a different type of strain.

8. The method of claim 1, wherein said first and second strain-inducing layers are formed so as to comprises silicon and nitrogen.

9. The method of claim 1, further comprising forming one or more first circuit elements in said first device area and forming one or more second circuit elements in said second device area, wherein said first and second circuit elements have minimum lateral dimensions of 50 nm or less.

10. A method, comprising:
forming a first strain-inducing layer of an interlayer dielectric material system of a semiconductor device above a first device area and a second device area, said second device area comprising a plurality of spaced conductive lines;
forming an etch stop liner above said first strain-inducing layer;
removing said etch stop liner and said first strain-inducing layer selectively from above said first device area;
forming a second strain-inducing layer above said first and second device areas after removing said etch stop layer selectively from above said first device area; and
removing material of said second strain-inducing layer selectively above said second device area by performing a removal process that comprises a wet chemical etch process.

11. The method of claim 10, wherein performing said removal process comprises applying a plasma assisted etch process prior to applying said wet chemical etch process.

12. The method of claim 10, further comprising forming an etch stop layer on said second strain-inducing layer prior to removing material of said second strain-inducing layer selectively above said second device area.

13. The method of claim 12, wherein forming said etch stop layer comprises forming at least one of an oxide material and a high-k dielectric material on said second strain-inducing layer.

14. The method of claim 10, wherein said first and second strain-inducing layers are formed so as to induce a different type of strain.

15. The method of claim 10, wherein performing said removal process comprises controlling at least one process parameter of said wet chemical etch process so as to maintain an overlap of said first and second strain-inducing layer in a boundary region located between said first and second device areas.

16. The method of claim 10, further comprising forming at least one further dielectric material layer above said first and second strain-inducing layers after performing said removal process.

17. A method of forming an interlayer dielectric material system of a semiconductor device, the method comprising:
forming a layer stack above a plurality of conductive lines, said layer stack comprising a first strain-inducing layer and a second strain-inducing layer;
performing a plasma assisted etch process so as to remove a first part of said second strain-inducing layer selectively to said first strain-inducing layer; and
performing a wet chemical etch process so as to further remove a second part of said second strain-inducing layer.

18. The method of claim 17, wherein forming said layer stack comprises forming an etch stop layer on said first strain-inducing layer prior to forming said second strain-inducing layer.

19. The method of claim 17, wherein forming said layer stack comprises forming said second strain-inducing layer above said first strain-inducing layer and forming an etch stop material on said second strain-inducing layer.

20. The method of claim 17, wherein forming said layer stack comprises forming said first strain-inducing layer with a first type of internal stress and forming said second strain-inducing layer with a second type of internal stress that differs from said first type.

* * * * *